United States Patent
Kurosu

(10) Patent No.: US 7,727,792 B2
(45) Date of Patent: Jun. 1, 2010

(54) LASER DIODE EPITAXIAL WAFER AND METHOD FOR PRODUCING SAME

(75) Inventor: Ken Kurosu, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 2 days.

(21) Appl. No.: 12/073,639

(22) Filed: Mar. 7, 2008

(65) Prior Publication Data

US 2009/0110018 A1   Apr. 30, 2009

(30) Foreign Application Priority Data

Oct. 30, 2007   (JP)   ............................... 2007-281941

(51) Int. Cl.
*H01L 21/00* (2006.01)

(52) U.S. Cl. ................... 438/46; 438/47; 257/E21.539; 257/E21.542

(58) Field of Classification Search ............ 438/46, 438/47; 257/11, 12, 85, 90, 94, 189, E27.012, 257/E21.539, E21.542, E21.543
See application file for complete search history.

(56) References Cited

U.S. PATENT DOCUMENTS

| | | | | |
|---|---|---|---|---|
| 5,010,556 A | * | 4/1991 | Imanaka et al. | .......... 372/46.01 |
| 5,153,889 A | * | 10/1992 | Sugawara et al. | ........ 372/45.01 |
| 5,656,538 A | * | 8/1997 | Gardner et al. | ................ 117/84 |

FOREIGN PATENT DOCUMENTS

JP   2002-25920   1/2002

* cited by examiner

*Primary Examiner*—Brook Kebede
(74) *Attorney, Agent, or Firm*—McGinn IP Law Group, PLLC

(57) ABSTRACT

A laser diode epitaxial wafer has an n-type GaAs substrate, an n-type cladding layer formed on the n-type GaAs substrate, an active layer formed on the n-type cladding layer, and a p-type cladding layer formed on the active layer. The n-type cladding layer, the active layer, and the p-type cladding layer are formed of an AlGaInP-based material. The p-type cladding layer has carbon as a p-type impurity. The p-type cladding layer has a carrier concentration in the range of not less than $8.0 \times 10^{17}$ cm$^{-3}$ and not more than $1.5 \times 10^{18}$ cm$^{-3}$.

7 Claims, 2 Drawing Sheets

LASER DIODE EPITAXIAL WAFER AND METHOD FOR PRODUCING SAME

The present application is based on Japanese patent application No. 2007-281941, the entire contents of which are incorporated herein by reference.

BACKGROUND OF THE INVENTION

1. Field of the Invention

The present invention relates to an epitaxial wafer for laser diodes, preferably suitable for AlGaInP-based red laser diodes, and a method for producing the epitaxial wafer.

2. Description of the Related Art

Red laser diodes (LDs) using AlGaInP-based semiconductors are widely used as a light source for DVD read/write.

FIG. 3 shows a cross-sectional schematic structure of a conventional AlGaInP-based LD epitaxial wafer.

As shown in FIG. 3, the epitaxial wafer is formed by using metal organic vapor phase epitaxy (MOVPE), sequentially stacking, on an n-type GaAs substrate 11, an n-type AlGaInP cladding layer 12, an undoped active layer 13, a p-type AlGaInP cladding layer 14 and a p-type cap layer 15.

During the p-type AlGaInP cladding layer 14 growth, diethylzinc (DEZ), dimethylzinc (DMZ) or the like is supplied as a doping raw material to cause zinc (Zn) (=p-type carrier) to be contained in the p-type AlGaInP cladding layer 14, to form the p-type AlGaInP cladding layer 14 (See, e.g., JP-A-2002-25920).

As mentioned above, in the conventional LD epitaxial wafer, the p-type AlGaInP cladding layer is caused to contain zinc (Zn) as its p-type carrier, but Zn is highly diffusive, and therefore diffuses into its adjacent layer. The Zn diffusion causes the problems of (1) non-uniform carrier concentration (=Zn concentration) in the depth direction of the p-type cladding layer, and (2) Zn invasion into the adjacent active layer. The device processing of the epitaxial wafer having the problems of (1) and (2) causes deterioration in laser diode properties, such as an increase in operation current Iop that is an important device property. Thus, the increase in operation current Iop will lead to a serious problem of being low in laser diode reliability, i.e., in its lifetime.

SUMMARY OF THE INVENTION

Accordingly, it is an object of the present invention to provide a laser diode epitaxial wafer, which obviates the above problems, and which has a uniform p-type carrier concentration in the p-type AlGaInP cladding layer, and less p-type impurity diffusion, and to provide a method for producing the epitaxial wafer.

(1) According to one embodiment of the invention, a laser diode epitaxial wafer comprises:

an n-type GaAs substrate;

an n-type cladding layer formed on the n-type GaAs substrate;

an active layer formed on the n-type cladding layer; and a p-type cladding layer formed on the active layer, wherein the n-type cladding layer, the active layer, and the p-type cladding layer each comprise an AlGaInP-based material and compose a double-hetero structure, the p-type cladding layer comprises carbon as a p-type impurity, and the p-type cladding layer comprises a carrier concentration in a range of not less than $8.0 \times 10^{17}$ cm$^{-3}$ and not more than $1.5 \times 10^{18}$ cm$^{-3}$.

In the above embodiment (1), the following modifications and changes can be made.

(i) The n-type cladding layer comprises silicon as an n-type impurity.

(2) According to another embodiment of the invention, a laser diode epitaxial wafer production method comprises:

supplying, to a heated n-type GaAs substrate, group III and V raw material gases, a carrier gas and dopant raw material gases; and epitaxially growing, on the n-type GaAs substrate, an n-type cladding layer, an active layer and a p-type cladding layer, wherein the epitaxially grown n-type cladding layer, the active layer and the p-type cladding layer each comprise an AlGaInP-based material and compose a double-hetero structure, and during growing the p-type cladding layer, carbon tetrabromide is supplied as the dopant raw material gas to allow the p-type cladding layer to comprise a carrier concentration in a range of not less than $8.0 \times 10^{17}$ cm$^{-3}$ and not more than $1.5 \times 10^{18}$ cm$^{-3}$.

In the above embodiment (2), the following modifications and changes can be made.

(ii) During growing the n-type cladding layer, a silicon doping raw material gas is supplied as the dopant raw material gas to dope the n-type cladding layer with silicon.

In the above embodiments (1) and (2), the following modifications and changes can be made.

(iii) The p-type cladding layer comprises a carrier concentration in a range of not less than $9.0 \times 10^{17}$ cm$^{-3}$ and not more than $1.2 \times 10^{18}$ cm$^{-3}$.

(iv) The p-type cladding layer comprises a carrier concentration distribution in a depth direction thereof of within ±5%, (v) The active layer comprises an undoped active layer and a carrier concentration of not more than $7.0 \times 10^{16}$ cm$^{-3}$.

According to this invention, it is possible to obtain a laser diode epitaxial wafer with a uniform p-type carrier concentration in the p-type AlGaInP cladding layer, and with less p-type impurity diffusion. Use of this laser diode epitaxial wafer allows fabrication of a laser diode with a low operation current value Iop and high reliability.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

An embodiment of a laser diode (LD) epitaxial wafer and a method for producing the same according to the invention will be explained below using the drawings.

Figure 1:
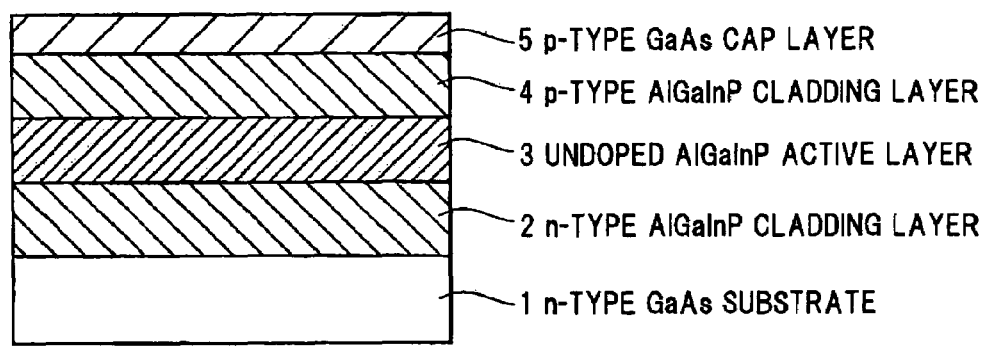
FIG. 1 is a cross-sectional view illustrating an embodiment of an AlGaInP-based laser diode epitaxial wafer according to the invention.

FIG. 1 shows a cross-sectional schematic structure of an AlGaInP-based laser diode epitaxial wafer in this embodiment. This LD epitaxial wafer comprises an n-type AlGaInP cladding layer 2, an undoped AlGaInP active layer 3, a p-type AlGaInP cladding layer 4, and a p-type GaAs cap layer 5, sequentially epitaxially stacked on an n-type GaAs substrate 1.

The p-type AlGaInP cladding layer 4 is doped with carbon (C) in the carrier concentration range of not less than $8.0 \times 10^{17}$ cm$^{-3}$ and not more than $1.5 \times 10^{18}$ cm$^{-3}$ as a p-type impurity. Also, the n-type AlGaInP cladding layer 2 is doped with silicon (Si) as an n-type impurity. Also, the p-type GaAs cap layer 5 is preferably doped with zinc (Zn) as a p-type impurity that allows a high concentration doping of not less than $1.0 \times 10^{19}$ cm$^{-3}$.

The above LD epitaxial wafer is formed with, e.g., a p-side electrode on a portion of the p-type GaAs cap layer 5 and an n-side electrode on the backside of the n-type GaAs substrate 1, by etching, deposition, etc.

The fabrication of the LD epitaxial wafer of FIG. 1 uses metal organic vapor epitaxy (MOVPE). Namely, the group III-V compound semiconductor epitaxial layers are sequentially grown and formed on the GaAs substrate 1 by heating the GaAs substrate 1 set in a vapor phase growth apparatus, and supplying to the GaAs substrate 1 group III and V raw material gases, carrier gas, and dopant raw material gases necessary for each epitaxial layer.

Used as the above group III raw material gas is, e.g., Al(CH$_3$)$_3$ (TMA: trimethyl aluminum), Al(C$_2$H$_5$)$_3$, Ga(CH$_3$)$_3$ (TMG: trimethyl gallium), Ga(C$_2$H$_5$)$_3$, In(CH$_3$)$_3$ (TMI: trimethyl indium), or In(C$_2$H$_5$)$_3$, or a combination thereof.

Also used as the group V raw material gas is, e.g., PH$_3$ (phosfin), TBP (tertiary butyl phosfin), AsH$_3$ (arsine), As(CH$_3$)$_3$, TBA (tertiary butyl arsine), NH$_3$ (ammonia), or a combination thereof.

Used as the carrier gas is H$_2$ (hydrogen), N$_2$ (nitrogen) or Ar (argon), or a combination thereof.

Used as the p-type dopant raw material gas is, e.g., CBr$_4$ (carbon tetrabromide), CCl$_3$Br, CCl$_4$, Zn(C$_2$H$_5$)$_2$ (DEZ: diethylzinc), Zn(CH$_3$)$_2$, Cp$_2$Mg, or a combination thereof. It should be noted, however, that for the above p-type AlGaInP cladding layer 4, CBr$_4$ (carbon tetrabromide) is preferably used as the p-type dopant raw material gas.

Used as the n-type dopant raw material gas is, e.g., Si$_2$H$_6$ (disilane), SiH$_4$ (silane), H$_2$Se, Te(C$_2$H$_5$)$_2$, or a combination thereof. It should be noted, however, that for the above n-type AlGaInP cladding layer 2, Si$_2$H$_6$ or SiH$_4$ is preferably used as the n-type dopant raw material gas, to dope it with silicon (Si).

In this embodiment, during the p-type AlGaInP cladding layer 4 growth, carbon tetrabromide (CBr$_4$) is supplied as a doping raw material, to cause carbon (C) in the carrier concentration range of not less than $8.0 \times 10^{17}$ cm$^{-3}$ and not more than $1.5 \times 10^{18}$ cm$^{-3}$ to be contained in the p-type AlGaInP cladding layer 4 as its p-type carrier. Carbon (C) is less diffusive compared to zinc (Zn), and allows a uniform carrier concentration (=C concentration) in the depth direction of the p-type cladding layer 4, and a decrease in being diffused into the adjacent undoped AlGaInP active layer 3. For this reason, use of the LD epitaxial wafer in this embodiment allows an LD with low operation current Iop and high reliability and long lifetime.

Also, conventional use of Zn as the p-type impurity of the p-type AlGaInP cladding layer causes Zn diffusion into the active layer and therefore leads to poor crystallinity, and consequently, evaluation of photoluminescence (PL) measurements shows a sharp increase in luminescent spectrum half width with increasing Zn carrier concentration. Particularly, since Zn carrier concentrations of more than $6.0 \times 10^{17}$ cm$^{-3}$ show its significant tendency, the Zn carrier concentration is conventionally restricted to as low as on the order of $4.0 \times 10^{17}$ cm$^{-3}$.

In this embodiment, however, even when to make the operation current Iop low, carbon (C) in the high carrier concentration range of not less than $8.0 \times 10^{17}$ cm$^{-3}$ and not more than $1.5 \times 10^{18}$ cm$^{-3}$ is contained in the p-type AlGaInP cladding layer 4, the less-diffusive carbon (C) doping allows its less diffusion into the undoped AlGaInP active layer 3 to inhibit crystallinity deterioration due to diffusion, and maintain a low PL half width.

Also, carbon tetrabromide (CBr$_4$) is the best carbon (C) doping raw material, and is preferable because of its high reliability and good doping efficiency. Further, silicon (Si) doped to the n-type AlGaInP cladding layer 2 as an n-type impurity is excellent because of its less counter diffusion with the p-type impurity.

In the above embodiment, various modifications may be made, for example, by providing a buffer layer between the n-type GaAs substrate 1 and the n-type AlGaInP cladding layer 2, providing an undoped AlGaInP guide layer between the n-type AlGaInP cladding layer 2 and the undoped AlGaInP active layer 3, and between the undoped AlGaInP active layer 3 and the p-type AlGaInP cladding layer 4, substituting the undoped AlGaInP active layer 3 with a multi-quantum well structure, or substituting the p-type GaAs cap layer 5 with another p-type semiconductor layer such as AlGaAs, GaP, or the like.

A red laser diode made from an LD epitaxial wafer in an embodiment as shown in FIG. 1 is used as a light source for DVD read/write, for example.

The LD epitaxial wafer in this embodiment comprises an Si-doped n-type (Al$_{0.4}$Ga$_{0.6}$)$_{0.5}$In$_{0.5}$P cladding layer (thickness 2.5 μm, target carrier concentration $8.0 \times 10^{17}$ cm$^{-3}$) 2, an undoped AlGaInP active layer 3, a C (carbon)-doped p-type (Al$_{0.4}$Ga$_{0.6}$)$_{0.5}$In$_{0.5}$P cladding layer (thickness 2.0 μm, target carrier concentration $1.0 \times 10^{18}$ cm$^{-3}$) 4, and a Zn-doped p-type GaAs cap layer (thickness 1.5 μm, target carrier concentration $3.0 \times 10^{19}$ cm$^{-3}$) 5, sequentially epitaxially stacked on an n-type GaAs substrate (thickness 500 μm, target carrier concentration $8.0 \times 10^{17}$ cm$^{-3}$) 1.

The LD epitaxial wafer in this embodiment is fabricated by setting the GaAs substrate 1 in a reaction furnace of a vapor phase growth apparatus, and using MOVPE. The growth temperature (substrate 1 surface temperature measured by a radiation thermometer installed on a surface facing the substrate 1) is 800° C., the growth pressure in the reaction furnace is approximately 10666 Pa (80 Torr), and the carrier gas is hydrogen.

The flow rates of raw materials supplied during each epitaxial layer growth are as follows.

For the n-type (Al$_{0.4}$Ga$_{0.6}$)$_{0.5}$In$_{0.5}$P cladding layer 2, TMG (trimethyl gallium): 12 (cc/min), TMA (trimethyl aluminum): 4 (cc/min), TMI (trimethyl indium): 20 (cc/min), Si$_2$H$_6$ (disilane): 510 (cc/min), and PH$_3$ (phosfin): 1800 (cc/min).

For the undoped AlGaInP active layer 3, TMG (trimethyl gallium): 16 (cc/min), TMA (trimethyl aluminum): 2 (cc/min), TMI (trimethyl indium): 24 (cc/min), and PH$_3$ (phosfin): 1800 (cc/min).

For the p-type (Al$_{0.4}$Ga$_{0.6}$)$_{0.5}$In$_{0.5}$P cladding layer 4, TMG (trimethyl gallium): 12 (cc/min), TMA (trimethyl aluminum): 4 (cc/min), TMI (trimethyl indium): 20 (cc/min), CBr$_4$ (carbon tetrabromide): 40 (cc/min), and PH$_3$ (phosfin): 1800 (cc/min).

For the p-type GaAs cap layer 5, TMG (trimethyl gallium): 12 (cc/min), DEZ (diethylzinc): 300 (cc/min), and AsH$_3$ (arsine): 2000 (cc/min).

Also, an epitaxial wafer in a comparison example is fabricated in which a Zn (zinc)-doped p-type $(Al_{0.4}Ga_{0.6})_{0.5}In_{0.5}P$ cladding layer is used in place of the C (carbon)-doped p-type $(Al_{0.4}Ga_{0.6})_{0.5}In_{0.5}P$ cladding layer 4 in the embodiment. The growth conditions of the comparison example are the same as in the embodiment, except for the difference that the p-type doping raw material supplied during p-type $(Al_{0.4}Ga_{0.6})_{0.5}In_{0.5}P$ cladding layer growth is not $CBr_4$, but DEZ (raw material flow rate 90 (cc/min)).

For the epitaxial wafers in the embodiment and the comparison example, the carrier concentration distribution in the depth direction of the p-type $(Al_{0.4}Ga_{0.6})_{0.5}In_{0.5}P$ cladding layer, and the carrier concentration in the undoped AlGaInP active layer are measured.

Figure 2:
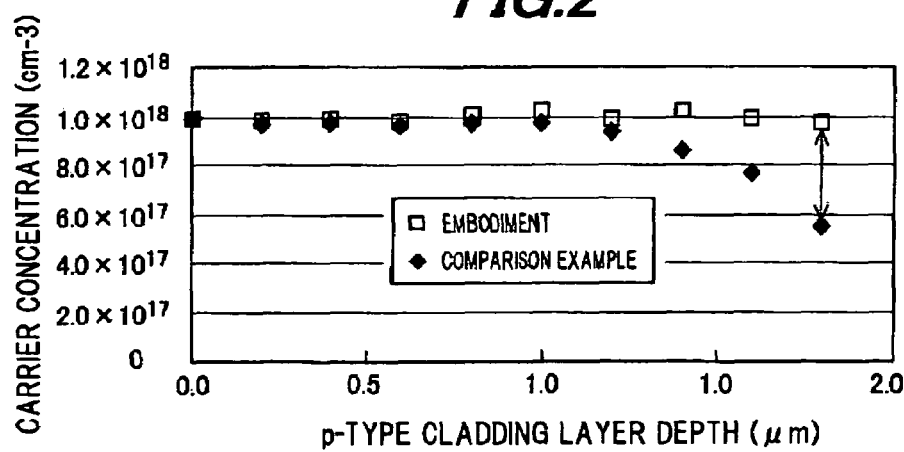
FIG. 2 is a diagram showing carrier concentration distributions in the depth direction of a p-type cladding layer of laser diode epitaxial wafers in the embodiment and a comparison example.
Figure 3:
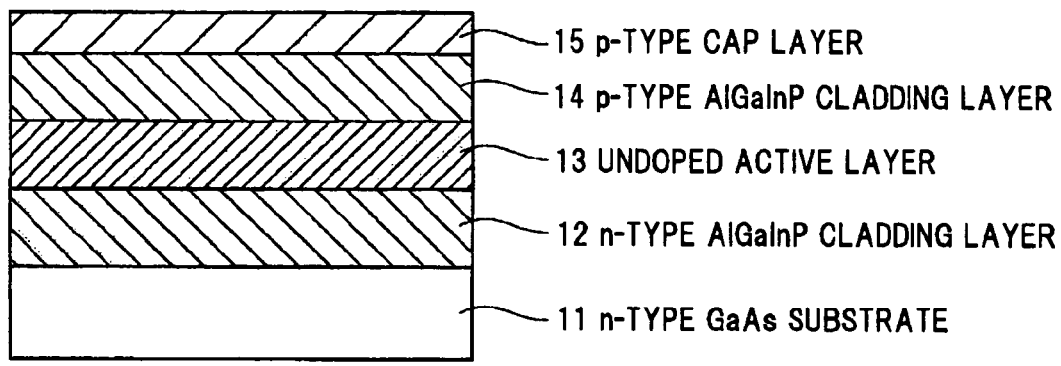
FIG. 3 is a cross-sectional view illustrating a conventional AlGaInP-based laser diode epitaxial wafer.

FIG. 2 shows carrier concentration distributions in the depth direction of the p-type $(Al_{0.4}Ga_{0.6})_{0.5}In_{0.5}P$ cladding layer (thickness 2 μm) in the embodiment (C doping) and the comparison example (Zn doping). As shown in FIG. 2, the carrier concentration distribution in the depth direction of the p-type $(Al_{0.4}Ga_{0.6})_{0.5}In_{0.5}P$ cladding layer in the embodiment, which is ±3%, is substantially smaller than that of the comparison example, which is ±25%.

Also, the carrier concentration in the undoped AlGaInP active layer in the embodiment, which is $2.0\times10^{16}$ cm$^{-3}$, is lower than that of the comparison example, which is $1.2\times10^{17}$ cm$^{-3}$.

In the C doping embodiment and Zn doping comparison example, the target carrier concentration in the p-type $(Al_{0.4}Ga_{0.6})_{0.5}In_{0.5}P$ cladding layer is $1.0\times10^{18}$ cm$^{-3}$. As shown in FIG. 2, however, the comparison example causes a substantial decrease in the carrier concentration in the undoped AlGaInP active layer side p-type $(Al_{0.4}Ga_{0.6})_{0.5}In_{0.5}P$ cladding layer. This is because the carrier concentration (=Zn concentration) in the p-type $(Al_{0.4}Ga_{0.6})_{0.5}In_{0.5}P$ cladding layer is decreased by being diffused into the undoped AlGaInP active layer, which leads to a corresponding increase in the p-type carrier concentration in the undoped AlGaInP active layer. In contrast to this, the embodiment allows inhibiting p-type carrier diffusion from the p-type $(Al_{0.4}Ga_{0.6})_{0.5}In_{0.5}P$ cladding layer, to make uniform the p-type carrier concentration in the p-type $(Al_{0.4}Ga_{0.6})_{0.5}In_{0.5}P$ cladding layer.

As a result, measurements of operation current Iop of LDs made from the LD epitaxial wafers in the embodiment and the comparison example show that the operation current Iop of the LD made from the LD epitaxial wafer in the embodiment is 67 mA, while the operation current Iop of the LD made from the LD epitaxial wafer in the comparison example is 80 mA, and it is therefore verified that the embodiment allows the low LD operation current Iop to ensure LD reliability and long lifetime.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A laser diode epitaxial wafer production method, comprising:
   supplying, to a heated n-type GaAs substrate, group III and V raw material gases, a carrier gas, and dopant raw material gases; and
   epitaxially growing, on the n-type GaAs substrate, an n-type cladding layer, an active layer, a p-type cladding layer, and a GaAs cap layer,
   wherein the epitaxially grown n-type cladding layer, the active layer, and the p-type cladding layer each comprises an AlGaInP-based material and has a double-hetero structure,
   wherein during the growing of the p-type cladding layer, carbon tetrabromide is supplied as a dopant raw material gas to allow the p-type cladding layer to comprise a carrier concentration in a range of not less than $8.0\times10^{17}$ cm$^{-3}$ and not more than $1.5\times10^{18}$ cm$^{-3}$,
   wherein during the growing of the n-type cladding layer, a silicon doping raw material gas is supplied as a dopant raw material gas to dope the n-type cladding layer with silicon, and
   wherein during the growing of the GaAs cap layer, zinc is supplied as a dopant raw material gas to allow the GaAs cap layer to comprise a carrier concentration in a range of at least $1.0\times10^{19}$ cm$^{-3}$.

2. The laser diode epitaxial wafer production method according to claim 1, wherein the p-type cladding layer comprises a carrier concentration in a range of not less than $9.0\times10^{17}$ cm$^{-3}$ and not more than $1.2\times10^{18}$ cm$^{-3}$.

3. The laser diode epitaxial wafer production method according to claim 1, wherein the p-type cladding layer comprises a carrier concentration distribution in a depth direction thereof of within ±5%.

4. The laser diode epitaxial wafer production method according to claim 1, wherein the active layer comprises an undoped active layer and a carrier concentration of not more than $7.0\times10^{16}$ cm$^{-3}$.

5. The laser diode epitaxial wafer production method according to claim 1, wherein during the growing of the n-type cladding layer, silicon is supplied as the dopant raw material gas to allow the n-type cladding layer to comprise a target carrier concentration of $8.0\times10^{17}$ cm$^{-3}$.

6. The laser diode epitaxial wafer production method according to claim 1, further comprising:
   forming an undoped guide layer comprising AlGaInP between the active layer and the p-type cladding layer.

7. The laser diode epitaxial wafer production method according to claim 1, wherein a growth temperature during the epitaxial growth is 800° C.

* * * * *